(12) United States Patent
Kaneko et al.

(10) Patent No.: US 10,517,181 B2
(45) Date of Patent: Dec. 24, 2019

(54) ELECTRONIC CONTROL DEVICE AND MANUFACTURING METHOD FOR SAME (71) Applicant: Hitachi Automotive Systems, Ltd., Hitachinaka-shi, Ibaraki (JP)

(72) Inventors: Yujiro Kaneko, Hitachinaka (JP); Yoshio Kawai, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 15/763,713

(22) PCT Filed: Aug. 5, 2016

(86) PCT No.: PCT/JP2016/073033
§ 371 (c)(1),
(2) Date: Mar. 27, 2018

(87) PCT Pub. No.: WO2017/056728
PCT Pub. Date: Apr. 6, 2017

(65) Prior Publication Data
US 2018/0288888 A1    Oct. 4, 2018

(30) Foreign Application Priority Data

Sep. 29, 2015   (JP) ................. 2015-190620

(51) Int. Cl.
*H05K 5/00*      (2006.01)
*B60R 16/02*     (2006.01)
(Continued)

(52) U.S. Cl.
CPC ........... *H05K 5/0069* (2013.01); *B60R 16/02* (2013.01); *H01R 12/707* (2013.01);
(Continued)

(58) Field of Classification Search
USPC ........................................ 361/752
See application file for complete search history.

(56) References Cited

U.S. PATENT DOCUMENTS 5,934,913 A * 8/1999 Kodama ............. H01R 12/58
439/557
6,285,551 B1  9/2001 Brandenburg et al.
(Continued)

FOREIGN PATENT DOCUMENTS

CN    1123515 A     5/1996
JP    2004-362928 A  12/2004
(Continued)

OTHER PUBLICATIONS

International Search Report (PCT/ISA/210) issued in PCT Application No. PCT/JP2016/073033 dated Nov. 29, 2016 with English-language translation (three (3) pages).
(Continued)

*Primary Examiner* — Hung S. Bui
(74) *Attorney, Agent, or Firm* — Crowell & Moring LLP (57) ABSTRACT

Providing an electronic control device excellent in reliability with low cost. An electronic control device includes: an electronic component; a control substrate on which the electronic component is mounted; a sealing resin for sealing the control substrate; and a metal housing case at least a portion of which is sealed with the sealing resin; a terminal for electrically connecting the control substrate with an external device; and a fixing plate for positioning and fixing the terminal with respect to the housing case. After the terminal is fixed to the housing case by the fixing plate, the terminal is electrically connected to the control substrate and subsequently a portion of the terminal and the control substrate are sealed with the sealing resin.

12 Claims, 7 Drawing Sheets (51) Int. Cl.
*H01R 12/71* (2011.01)
*H02G 3/16* (2006.01)
*H01R 12/70* (2011.01)
*H01R 13/6585* (2011.01)
*H01R 43/20* (2006.01)
*H01R 43/24* (2006.01)
*H05K 5/06* (2006.01)

(52) U.S. Cl.
CPC ......... *H01R 12/7064* (2013.01); *H01R 12/71* (2013.01); *H01R 13/6585* (2013.01); *H01R 43/205* (2013.01); *H01R 43/24* (2013.01); *H02G 3/16* (2013.01); *H05K 5/0017* (2013.01); *H05K 5/0034* (2013.01); *H05K 5/0073* (2013.01); *H05K 5/065* (2013.01)

(56) References Cited

U.S. PATENT DOCUMENTS

| | | | |
|---|---|---|---|
| 6,307,749 B1 | 10/2001 | Daanen et al. | |
| 6,739,893 B2* | 5/2004 | Hallitschke | H05K 5/0069 439/248 |
| 6,755,677 B2* | 6/2004 | Kamiya | H01R 43/205 439/381 |
| 7,149,089 B2* | 12/2006 | Blasko | H01R 13/521 361/752 |
| 7,209,367 B2* | 4/2007 | Nakano | H05K 3/3405 361/803 |
| 7,697,300 B2* | 4/2010 | Brandt | B60R 16/0239 361/704 |
| 8,292,639 B2* | 10/2012 | Achammer | H01R 12/585 29/832 |
| 8,872,242 B2* | 10/2014 | Hayashi | H01L 21/28008 257/263 |
| 8,962,999 B2* | 2/2015 | John | H01R 12/7023 174/59 |
| 9,320,165 B2* | 4/2016 | Gruber | H05K 5/03 |
| 9,480,143 B2* | 10/2016 | Washeleski | H05K 1/0206 |
| 9,545,020 B2* | 1/2017 | Kanzaki | H05K 5/0069 |
| 2005/0122694 A1* | 6/2005 | Kane | H05K 5/0069 361/752 |
| 2006/0012034 A1 | 1/2006 | Kadoya et al. | |
| 2006/0281230 A1 | 12/2006 | Brandenburg et al. | |
| 2018/0222408 A1* | 8/2018 | Shigyo | H02G 3/14 |

FOREIGN PATENT DOCUMENTS

| | | |
|---|---|---|
| JP | 2006-190725 A | 7/2006 |
| JP | 2007-273796 A | 10/2007 |
| JP | 2010-62220 A | 3/2010 |
| JP | 2010-170728 A | 8/2010 |
| JP | 2014-15080 A | 1/2014 |
| JP | 2014-53382 A | 3/2014 |

OTHER PUBLICATIONS

Japanese-language Written Opinion (PCT/ISA/237) issued in PCT Application No. PCT/JP2016/073033 dated Nov. 29, 2016 (three (3) pages).

Japanese-language Office Action issued in counterpart Japanese Application No. 2017-542991 dated Jan. 8, 2019 with English translation (five (5) pages).

Extended European Search Report issued in counterpart European Application No. 16850905.7 dated Apr. 17, 2019 with English translation (eight (8) pages).

* cited by examiner

ELECTRONIC CONTROL DEVICE AND MANUFACTURING METHOD FOR SAME

TECHNICAL FIELD

The present invention relates to an electronic control device such as an engine control unit and an automatic transmission control unit used for an automobile, and particularly to a casing structure of the electronic control device.

BACKGROUND ART

With the background of environmental and energy problems, the trend of automobile electronics is accelerating, and the number of electronic control devices installed has been greatly increasing. This leads to limitation of installation space for the electronic control devices, and thus, the electronic control devices are inevitably installed in an engine compartment with severe environmental conditions compared with other locations of an automobile. On the other hand, with a trend of an expanded cabin space to achieve enhanced comfortability of an automobile, the engine compartment has been downsized. This necessitates arrangement of a large number of electronic control devices and wire harnesses in a downsized engine compartment, leading to a difficulty in layout, an increase in weight, and increase in cost. This generates a demand for an electronic control device that is smaller, lighter, and lower in cost. In addition, the wire harness tends to be shortened. This results in, for example, installation of the engine control device at a position closer to the engine, leading to a concern about an influence of high heat and high vibration of the engine on the engine control device. To cope with this, there is a need to enhance heat resistance and vibration resistance of the electronic control device. As a countermeasure, there is a known structure in which a control substrate on which electronic components are mounted is sealed with resin (see PTL An electric and electronic module described in PTL 1 includes an electronic circuit board on which an electronic circuit is mounted and a metal base for mounting the electronic circuit board, and the electronic circuit board is sealed with a resin.

CITATION LIST

Patent Literatures

PTL 1: JP 2007-273796 A

SUMMARY OF INVENTION

Technical Problem

Unfortunately, however, PTL 1 makes no particular consideration regarding the number of components and reliability of connector terminals for external connection at the time of performing resin-sealing on an electronic circuit board.

In particular, an engine control device in recent years has more and more numbers of connector circuits along with enhancement in functions to be compatible with fuel consumption enhancement, leading to increased ratios of dimensions and costs of connectors within downsized engine control devices.

This makes it a problem to provide an electronic control device excellent in productivity and reliability with low cost.

Solution to Problem

In order to solve the above-described problem, an electronic control device according to the present invention includes: an electronic component; a control substrate on which the electronic component is mounted; a sealing resin for sealing the control substrate; a fixing member at least a portion of which is sealed with the sealing resin; a terminal for providing electrical connection between the control substrate and an external device; and a fixing plate for positioning and fixing the terminal with respect to the fixing member.

Advantageous Effects of Invention

According to the present invention, in a case where a circuit board of an electronic control device is sealed with a resin, it is possible to reduce the cost of a connector for external connection while achieving reliability.

BRIEF DESCRIPTION OF DRAWINGS

FIGS. 2A to 2H are configurations and an assembly procedure of an electronic control device of a first embodiment.

DESCRIPTION OF EMBODIMENTS

Hereinafter, a configuration and an assembly procedure of an electronic control device according to specific embodiments of the present invention will be described with reference to the accompanying drawings.

First Embodiment

Figure 1A:
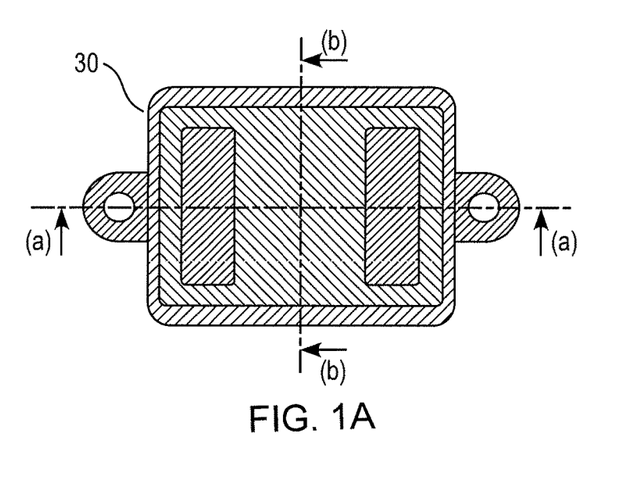
FIGS. 1A to 1C are cross-sectional views of an electronic control device.
Figure 1B:
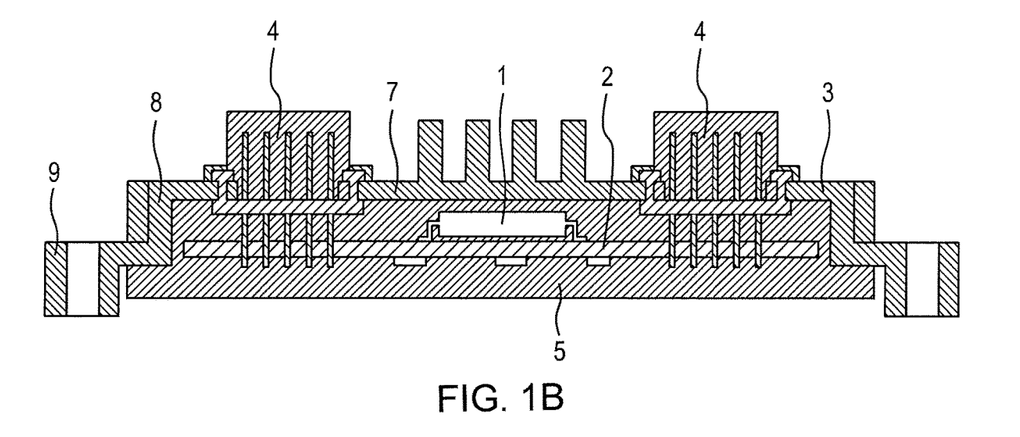
Figure 1C:
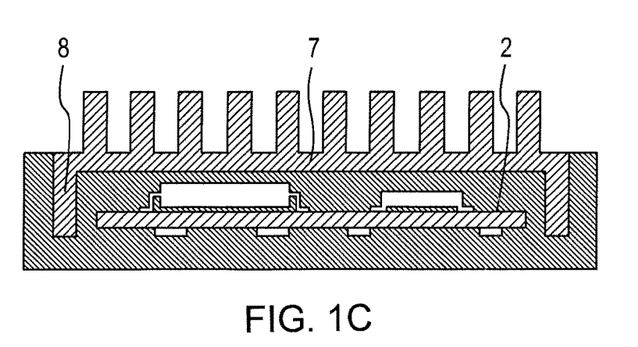

FIGS. 1A to 1C are a cross-sectional view illustrating a control device according to the first embodiment. FIGS. 2A to 2H are a configuration and an assembly procedure of the control device illustrated in FIGS. 1A to 1C.

As illustrated in FIGS. 1A to 2H, the electronic control device according to the present invention includes a control substrate 2 on which an electronic component 1 such as a microcomputer is mounted, a housing case 3, a connector 4, and a sealing resin 5.

Figure 2A:
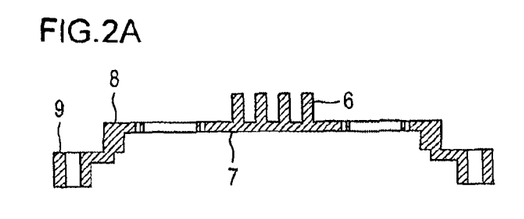
Figure 2B:
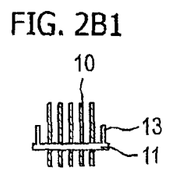
Figure 2B:
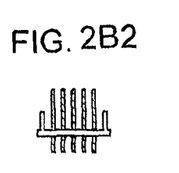

As illustrated in FIG. 2A, the housing case 3 may be integrally molded together with a heat sink 7 having a heat dissipation fin 6 for dissipating heat generated from electronic components to the outside of the electronic control device, an electromagnetic shield unit 8 that shields electromagnetic noise, and a fixture for vehicle mounting 9 for fixing the electronic control device to a vehicle. The material is preferably a metal material having high thermal conductivity, shielding property and rigidity, and it is preferable to use aluminum or an aluminum alloy from the viewpoints of mass productivity, weight reduction, heat dissipation property, and cost. By integrating the heat sink 7, the shield unit 8, and the fixture for vehicle mounting 9 in this manner, it is possible to reduce the number of components, leading to cost reduction and enhancement of productivity.

With the fixture for vehicle mounting 9 integrally molded with the housing case 3, heat dissipated from the electronic component 1 towards the housing case 3 such as the heat sink 7 enables enhanced heat dissipation amount to the vehicle body via the fixture for vehicle mounting 9.

As illustrated in FIGS. 2B1 and 2B2, the connector 4 is formed by fabricating a connector unit assembly 12 constituted with a terminal 10 for connecting a vehicle-side harness with the control substrate 2, and a fixing plate 11 for aligning and holding the terminals 10 at a prescribed pitch. The fixing plate 11 includes pins 13 for increasing insertability into the housing case 3 to be described below and for facilitating positioning. The number of the pins 13 is preferably two or more. The material of the terminal 10 may preferably be copper or a copper alloy from the viewpoint of conductivity, downsizing, and cost. The material of the fixing plate 11 may preferably be a polybutylene terephthalate (PBT) resin, a polyamide (PA) 66 resin, and a polyphenylene sulfide (PPS) resin from the viewpoint of light weight and excellent heat resistance.

Figure 2C:
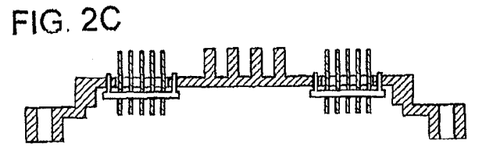
Figure 2D:
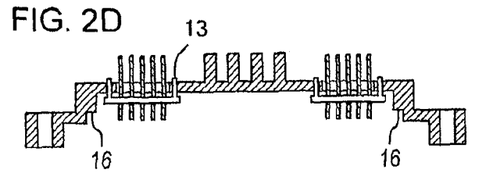

Subsequently, as illustrated in FIGS. 2A to 2C, the housing case 3 and the connector unit assembly 12 are assembled to each other. At that time, the pins 13 of the connector unit assembly 12 are inserted into mutually opposing penetration holes on the housing case 3, and the fixing plate 11 is brought into contact with the housing case 3, thereby positioning the connector unit assembly 12 and the housing case 3. By designing the diameter of the pin 13 of the connector unit assembly 12 and the diameter of the penetration hole of the housing case 3 so as to have a small diameter difference, it is possible to suppress a positional displacement of the connector unit assembly 12 in a planar direction and thus to prevent the terminal 10 and the housing case from coming in contact with each other.

Figure 3A:
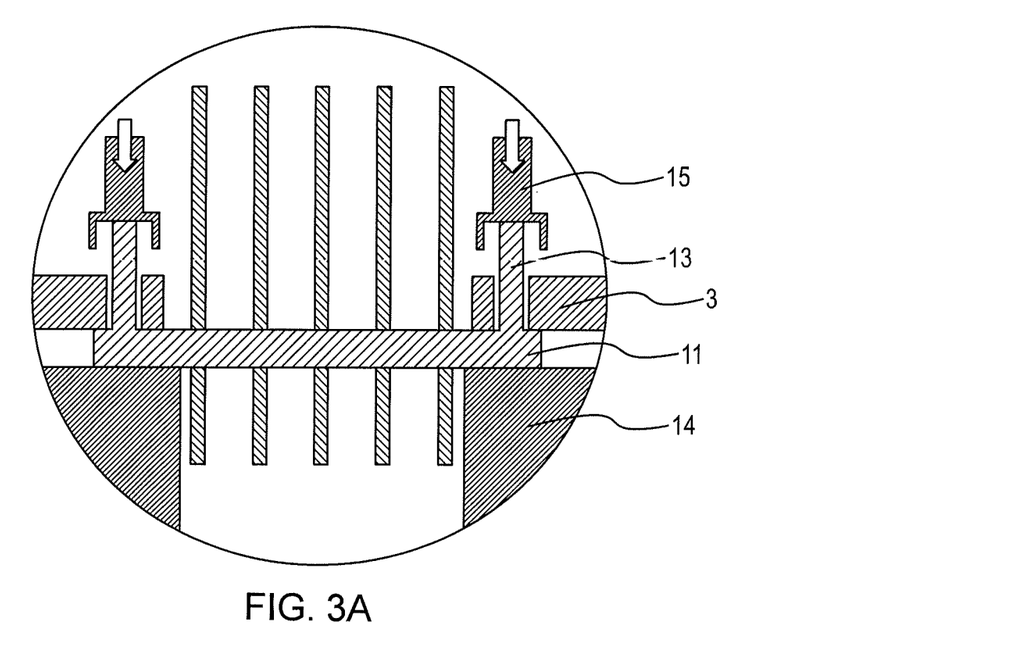
FIGS. 3A and 3B are enlarged sectional views of a thermal caulking portion of the first embodiment.
Figure 3B:
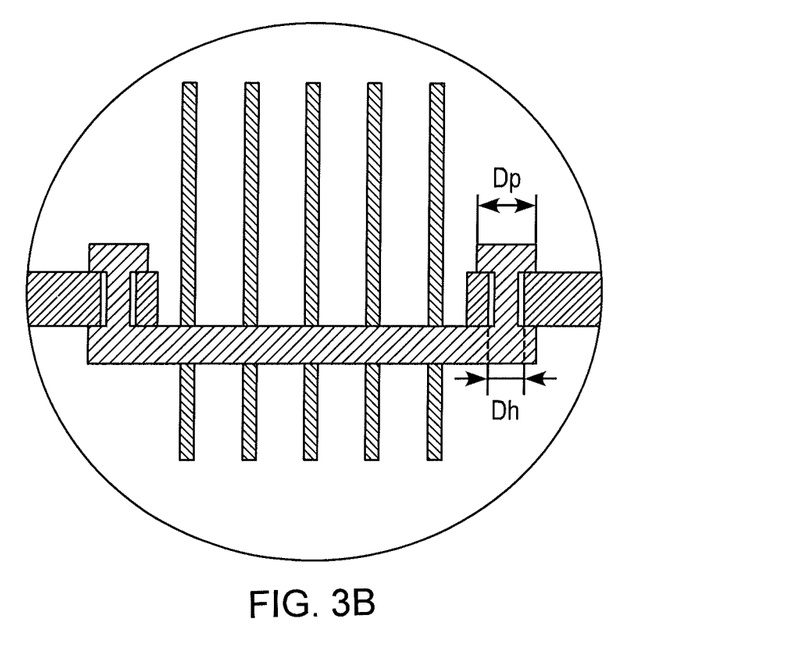

When the position of the connector unit assembly 12 with respect to the housing case 3 as a fixing member is determined, tips of the pins 13 protruding from the housing case 3 are fixed by thermal caulking as illustrated in FIGS. 2A to 2D. FIG. 3A illustrates an enlarged cross-sectional view of the thermal caulking portion. The fixing plate 11 is placed on a cradle 14, and a preheated thermal caulking jig 15 is pressed against the tip of the pin 13 to soften and thermally deform the tip of the pin to be pressed against the housing case 3, thereby forming a thermal caulking portion as illustrated in FIG. 3B. At this time, a pin diameter (Dp) of the thermal caulking portion is preferably formed to be larger than a housing case penetration hole diameter (Dh). This makes it possible to increase the fixing force.

After the connector unit assembly 12 is fixed, the control substrate 2 on which the electronic component 1 such as a microcomputer is mounted is assembled to the die casting case 3 as illustrated in FIGS. 2(*e*) and 2(*f*). At that time, an electronic component susceptible to external electromagnetic noise and an electronic component likely to generate electromagnetic noise, such as a microcomputer and a quartz oscillator, are mounted on a surface of the control substrate 2 facing the housing case 3. This configuration enables the electronic component 1 to be surrounded by wiring layers of the housing case 3 and the control substrate 2, leading to enhancement of the electromagnetic shielding property. In order to further enhance the electromagnetic shielding property, it is preferable to provide a solid pattern in one layer of the wiring layers of the control substrate or in the periphery where the electronic component 1 is mounted. This makes it possible to also enhance the shielding property against electromagnetic noise from the surface not facing the housing case 3.

Figure 2E:
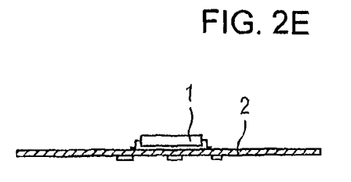
Figure 2H:
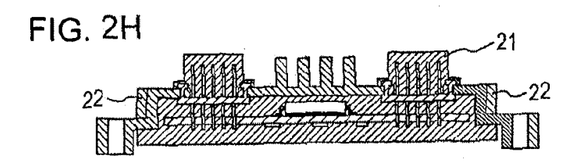

A resin wiring board based on glass epoxy resin or the like is used as the control substrate 2. In connecting the electronic component 1 to the control substrate 2, a lead-free solder such as Sn—Cu solder, Sn—Ag—Cu solder, and Sn—Ag—Cu—Bi solder is applied. By setting the control substrate 2 on a substrate receiving unit 16 of the housing case 3, the position in a height direction is determined, and subsequently the control substrate 2 is fixed to the housing case 3 using screws (not illustrated). The number of fixation points by screws may preferably be three or more. In connecting the terminal 10 of the connector unit assembly 12 with the control substrate 2, a lead-free solder such as Sn—Cu solder, Sn—Ag—Cu solder, and Sn—Ag—Cu—Bi solder is applied to a through hole portion 17 of the control substrate 2, into which the terminal 10 is inserted, so as to achieve connection. Note that the type of the connector 4 may be a surface mounting type or a press fit type.

Figure 4A:
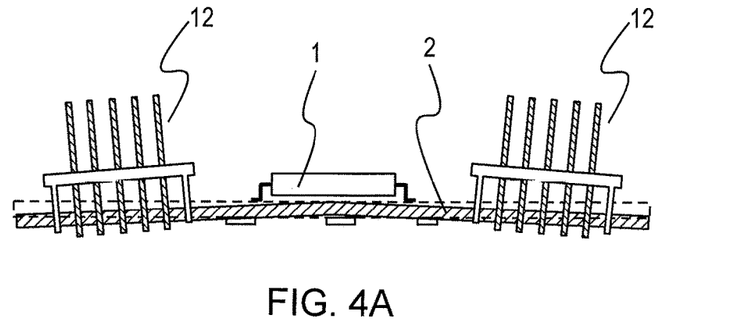
FIGS. 4A and 4B are configurations for fixing a connector unit assembly to a control substrate.

What is important here is a method of fixing the connector unit assembly 12. Specifically, in a case where the connector unit assembly 12 is fixed to the control substrate 2 instead of the housing case 3, the positioning pin 13 is to be inserted into the control substrate 2. This would generate a need to provide a penetration hole for the positioning pin 13 on the control substrate 2, and increase the substrate area correspondingly. In addition, in a case where the terminal 10 of the connector unit assembly 12 and the through hole portion 17 of the control substrate 2 are joined with each other by soldering, the connector unit assembly 12 and the control substrate 2 individually expand and contract due to a thermal history by solder joining, leading to individual deformation. In this process, however, there is a difference in the amount of expansion and contraction between the connector unit assembly 12 and the control substrate 2, leading to generation of warping in the connector unit assembly 12 and the control substrate 2 after joining them, with respect to an original shape of the control substrate 2 indicated by the broken line as illustrated in FIG. 4A.

Figure 4B:
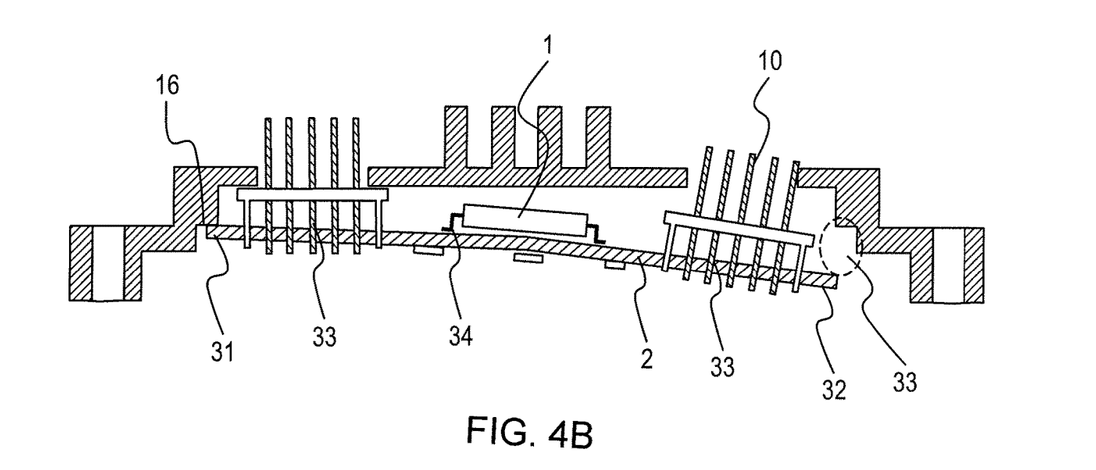

In a case where the connector unit assembly 12 and the control substrate 2 in which the warping is generated are fixed to the housing case 3, placing one end 31 of the control substrate 2 on the substrate receiving unit 16 would generate a gap 33 corresponding to the amount of warping at the other end of the control substrate 2 as illustrated in FIG. 4B. Due to greater rigidity of the housing case 3 than the rigidity of the control substrate 2 and the flat shape of the substrate receiving unit 16, screwing the control substrate 2 to the housing case 3 in this state would bring the warping of the control substrate 2 back to a former state. This would cause a stress to remain in the a solder joint portion 33 between the terminal 10 of the connector unit assembly 12 and the through hole portion 17, and in a solder joint portion 34 between the control substrate 2 and the electronic component 1, leading to a decrease in solder connection lifetime.

To cope with this problem, as described in the embodiment, the method of fixing the connector unit assembly 12 may preferably include first fixing the connector unit assembly 12 to the housing case 3, and thereafter joining the terminal 10 of the connector unit assembly 12 to the through hole portion 17 of the control substrate 2. With this method, it is possible to suppress the warping of the connector unit assembly 12 and the control substrate 2, and also to suppress stress generated at the joint portion between the terminal 10 and the through hole portion 17.

As illustrated in FIGS. 2A to 2G, a sub-assembly 20 fabricated in this manner is set in a mold for resin sealing. In the present embodiment, the sub-assembly is set on an upper die 18 that is a movable die, then the upper die is moved and set onto a lower die 19 as a fixed die. The fin portion 6 of the housing cover 3 to be desirably exposed from the resin 5 after resin sealing and the fixture for vehicle mounting 9 have a structure to be held by a mold in order to prevent entry of resin during resin molding.

For the purpose of ensuring the fluidity of the sealing resin 5 and enabling the resin to fill over narrower sites inside of the mold, it is preferable to preheat the mold, the sub-assembly, and the resin. The sealing resin 5 may be a thermosetting epoxy resin, an unsaturated polyester resin, or a thermoplastic resin. Examples of sealing methods include transfer molding, compression molding, injection molding, and hot melt. Physical property values of the sealing resin 5 are desirably such that the linear expansion coefficient is 10 to $30 \times 10^{-6}/°$ C., the thermal conductivity is 0.5 to 3 W/mK.

After completion of resin filling into the mold, the sealing resin is cured in the mold. After curing, the mold is opened and the resin molded product is taken out to complete fabrication of the electronic control device illustrated in FIG. 2H.

Note that a rising portion 22 on the outer periphery of the housing case excluding the fixture for vehicle mounting 9 is preferably covered with the sealing resin 5. This configuration increases the contact area between the housing case 3 and the sealing resin 5, making it possible to enhance waterproof/anti-saline reliability. Since this configuration further enables reduction of expansion and shrinkage of the housing case 3, it is possible to enhance waterproof and anti-saline reliability and solder connection reliability.

In addition, it is further preferable to cover the thermal caulking portion of the connector terminal fixing plate 11 with the sealing resin 5. This makes it possible to suppress deterioration of the thermal caulking portion and suppress entry of water and salt water from the thermal caulking portion.

Finally, it is more preferable that a housing 21 of the connector 4 is also integrally molded with the sealing resin 5. This can omit necessity to provide the connector housing as a separate component, leading to reduction of the number of components, and probably leading to cost reduction and productivity enhancement.

Second Embodiment

Figure 5:
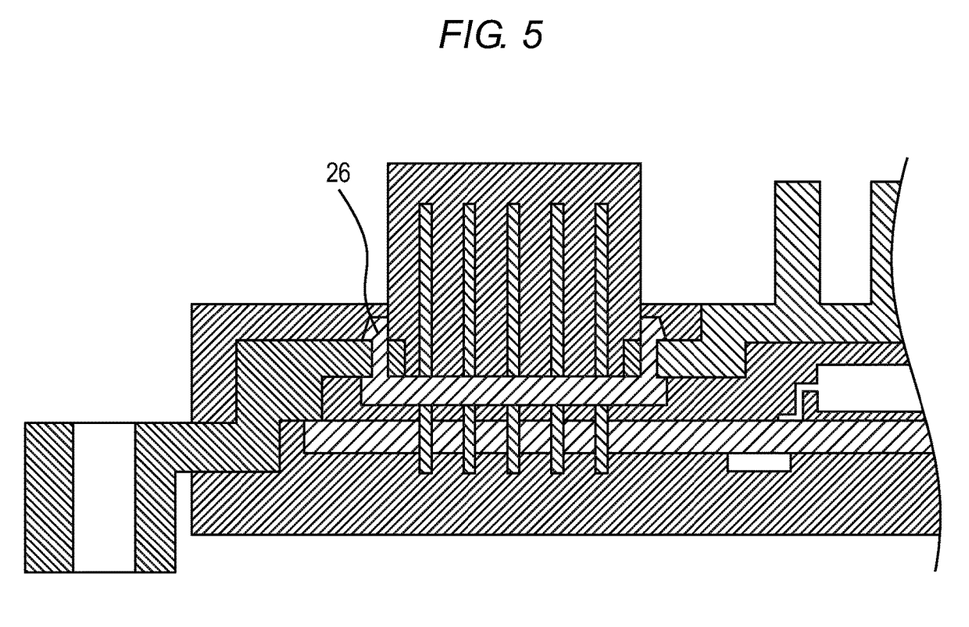
FIG. 5 is a configuration of an electronic control device of a second embodiment.

The configuration of a second embodiment will be described in comparison with the first embodiment. While the first embodiment is a case where the fixing plate 11 is fixed to the housing case 3 by thermal caulking, the second embodiment uses a structure in which the fixing plate 11 is fixed by a snap fit 26 as illustrated in FIG. 5.

Third Embodiment

Figure 6:
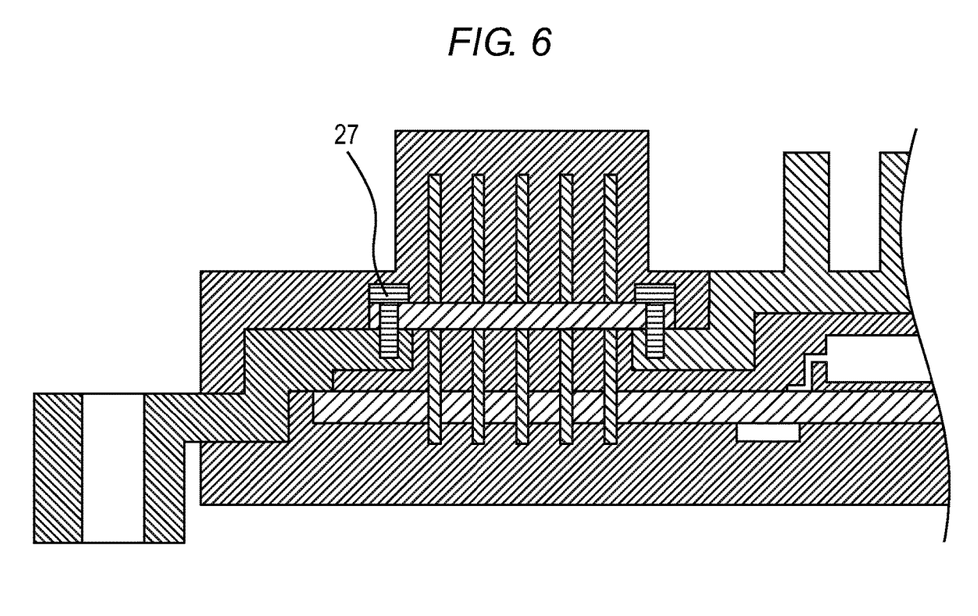
FIG. 6 is a configuration of an electronic control device of a third embodiment.

The configuration of a third embodiment will be described in comparison with the first embodiment. While the first embodiment is a case where the fixing plate 11 is fixed to the housing case 3 by thermal caulking, the second embodiment uses a structure in which the fixing plate 11 is fixed by a screw 27 as illustrated in FIG. 6.

Fourth Embodiment

Figure 7:
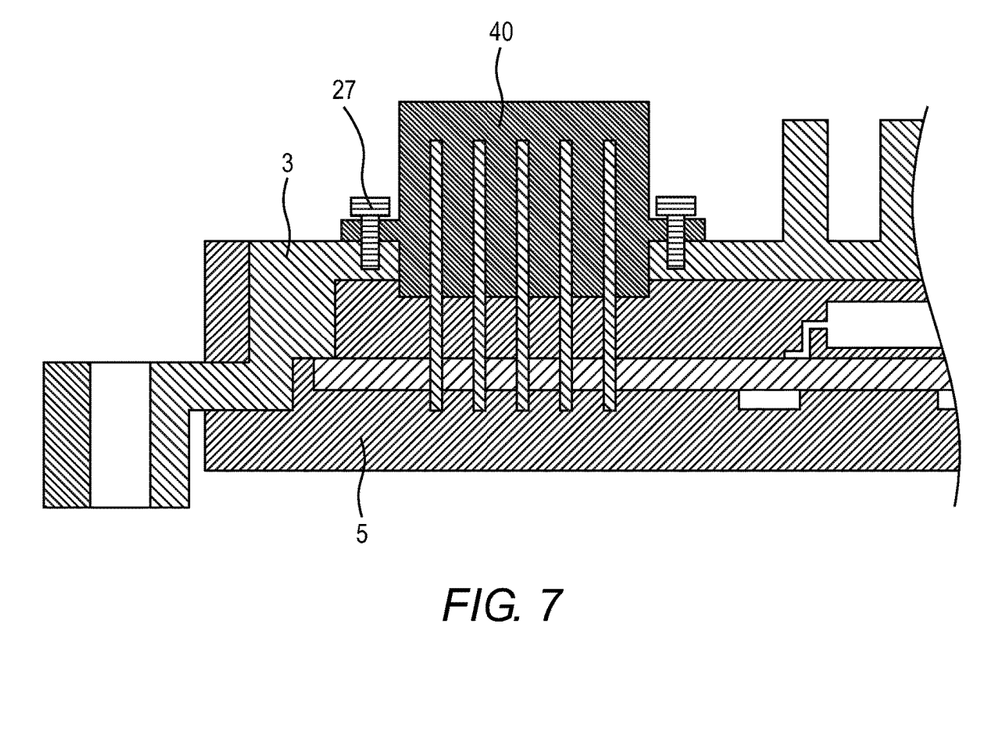
FIG. 7 is a configuration of an electronic control device of a fourth embodiment.

The configuration of a fourth embodiment will be described in comparison with the first embodiment. While the first embodiment is a case where the connector unit assembly 12 is fixed to the housing case 3, the fourth embodiment uses a connector 40 with a housing separately from the sealing resin 5 as illustrated in FIG. 7. The screw 27, or the like, may be used for fixing the connector 40 and the housing case 3. In the present embodiment, the connector 40 includes a plate portion for fixing the plurality of terminals 10 and this plate portion can be used in place of the fixing plate 11 so as to position and fix the terminals 10 to the housing case 3.

As above, embodiments of the control device according to the present invention have been described. The present invention is not limited to the above-described embodiments but may include various design modifications without departing from the spirit according to the present invention described in claims.

REFERENCE SIGNS LIST 1 electronic component
2 control substrate
3 housing case
4 connector
5 sealing resin
5a sealing resin to cover heat dissipation fin
5b sealing resin to cover rising portion of outer periphery of housing case
6 heat dissipation fin
7 heat sink
8 electromagnetic shield unit
9 fixture for vehicle mounting
10 terminal
11 fixing plate
12 connector unit assembly
13 pin
14 cradle
15 thermal caulking jig
16 substrate receiving unit
17 through hole portion
18 upper mold
19 lower mold
20 sub-assembly
21 connector housing
22 rising portion of outer periphery of housing case
24 penetration hole
25 mold
26 snap fit
27 screw
30 electronic control device
31 one end of control substrate
32 other end of control substrate
33 solder joint portion between terminal and through hole portion
34 solder joint portion between control substrate and electronic component

The invention claimed is:
1. An electronic control device comprising:
an electronic component;
a control substrate on which the electronic component is mounted;
a sealing resin for sealing the control substrate;
a fixing member at least a portion of which is sealed with the sealing resin;

a connector terminal for providing an electrical connection between the control substrate and an external device; and a fixing plate for positioning and fixing the connector terminal with respect to the fixing member, wherein
the connector terminal is mold-sealed, so as to be fixed to the fixing member by the fixing plate, such that the fixing plate is sealed by the sealing resin,
the connector terminal includes a plurality of metal terminals,
the sealing resin covers the connector terminal,
a connector housing to be fitted with an external connector is integrally formed,
the fixing member is a metal plate member and includes an exposed portion at least a portion of which is exposed from the sealing resin, and
the exposed portion includes one of a heat sink portion that dissipates heat generated from the electronic component to the outside and a fixture for vehicle body mounting provided to perform fixation to the vehicle body.

2. The electronic control device according to claim 1, wherein the connector terminal is provided so as to perpendicularly penetrate the fixing plate and the fixing member.

3. The electronic control device according to claim 1, wherein the fixing plate includes a pin extending toward the fixing member,
the pin is inserted into a penetration hole provided at a portion of the fixing member opposed to the fixing plate, and
the fixing plate is fixed to the fixing member by thermal caulking.

4. The electronic control device according to claim 3, wherein a position fixed with the thermal caulking is covered with the sealing resin.

5. The electronic control device according to claim 4, wherein the fixing plate is fixed to the fixing member by thermal caulking at least at two locations.

6. The electronic control device according to claim 3, wherein a tip of the pin protrudes from the penetration hole of the fixing member after the thermal caulking, and
the diameter of the pin tip is larger than the diameter of the penetration hole.

7. The electronic control device according to claim 1, wherein a material of the fixing plate is a thermoplastic resin.

8. The electronic control device according to claim 1, wherein the material of the sealing resin is a thermosetting resin.

9. The electronic control device according to claim 1, wherein the fixing plate is fixed to the fixing member by a snap fit.

10. The electronic control device according to claim 1, wherein the fixing plate is fixed to the fixing member by a screw.

11. The electronic control device according to claim 1, wherein
the fixing plate is a portion of a connector housing to be fitted with an external connector by covering the connector terminal, and
the fixing plate is formed separately from the sealing resin.

12. A method for manufacturing an electronic control device, the method comprising:
providing an electronic component;
providing a control substrate on which the electronic component is mounted;
sealing, with a sealing resin, the control substrate;
providing a fixing member at least a portion of which is sealed with the sealing resin;
providing an electrical connection, with a connector terminal, between the control substrate and an external device; and
positioning and fixing, with a fixing plate, the connector terminal with respect to the fixing member, wherein
the connector terminal is mold-sealed, so as to be fixed to the fixing member by the fixing plate, such that the fixing plate is sealed by the sealing resin,
the connector terminal includes a plurality of metal terminals,
the sealing resin covers the connector terminal,
a connector housing to be fitted with an external connector is integrally formed,
the fixing member is a metal plate member and includes an exposed portion at least a portion of which is exposed from the sealing resin, and
the exposed portion includes one of a heat sink portion that dissipates heat generated from the electronic component to the outside and a fixture for vehicle body mounting provided to perform fixation to the vehicle body.

* * * * *